United States Patent [19]
Liu

[11] Patent Number: 5,567,270
[45] Date of Patent: Oct. 22, 1996

[54] PROCESS OF FORMING CONTACTS AND VIAS HAVING TAPERED SIDEWALL

[75] Inventor: Ming-Hsi Liu, Chung Li City, Taiwan

[73] Assignee: Winbond Electronics Corp., Hsin-Chu, Taiwan

[21] Appl. No.: 543,525

[22] Filed: Oct. 16, 1995

[51] Int. Cl.$^6$ .................................................. H01L 21/28
[52] U.S. Cl. ...................... 156/644.1; 437/195; 437/228; 437/947; 437/981; 437/187
[58] Field of Search ................................... 437/187, 195, 437/947, 981, 228 CON, 228 S; 257/774; 156/644.1

[56] References Cited

U.S. PATENT DOCUMENTS

| | | | |
|---|---|---|---|
| 4,879,254 | 11/1989 | Tsuzuki et al. | 437/228 |
| 5,180,689 | 1/1993 | Liu et al. | 437/981 |
| 5,203,957 | 4/1993 | Yoo et al. | 156/643 |
| 5,227,014 | 7/1993 | Crotti et al. | 156/644 |
| 5,279,990 | 1/1994 | Sun et al. | 437/195 |
| 5,294,296 | 3/1994 | Yoon et al. | 437/981 |
| 5,444,021 | 8/1995 | Chung et al. | 437/195 |

FOREIGN PATENT DOCUMENTS

| | | |
|---|---|---|
| 62-043133 | 2/1987 | Japan . |
| 63-260134 | 10/1988 | Japan . |
| 1-010629 | 1/1989 | Japan . |
| 4-167524 | 6/1992 | Japan . |
| 4-168723 | 6/1992 | Japan . |
| 6-163482 | 6/1994 | Japan . |

Primary Examiner—George Fourson
Assistant Examiner—Thomas G. Bilodeau
Attorney, Agent, or Firm—Jason Z. Lin

[57] ABSTRACT

A process of forming contact holes having tapered sidewalls is accomplished by establishing sidewall spacers in the contact hole area. A photo-resist layer is formed on top of a semiconductor device having a substrate with doped regions, a polysilicon layer and a multi-layer insulating structure. The photo-resist layer has openings defining area slightly larger than the sizes of the actual contact holes. The multi-layer insulating structure is anisotropically etched to remove one half of the thickness in the opening area and a void with vertical sidewall is formed in the insulating structure. After etching, the photo-resist layer is removed and a temporary insulating layer having the same composition as the top layer of the multi-layer insulating structure is deposited uniformly over the surface of the multi-layer insulating structure. The temporary insulating layer is etched and removed by anisotropically etching process. A part of the remaining temporary insulating layer in the opening area forms a sidewall spacer on the vertical sidewall of the void. The surface of the multi-layer insulating structure and the sidewall spacer is further anisotropically etched to expose the semiconductor substrate in the opening area and complete the formation of the contact hole with tapered sidewall. The process is also applicable to the formation of metal vias.

9 Claims, 14 Drawing Sheets

PROCESS OF FORMING CONTACTS AND VIAS HAVING TAPERED SIDEWALL

FIELD OF THE INVENTION

The present invention relates to a process of forming contact holes and metal vias for semiconductor devices, more specifically to a process of forming contact holes and metal vias having tapered sidewall.

BACKGROUND OF THE INVENTION

In the manufacture of integrated circuits, the density of the circuits is greatly dependent on the sizes of contact holes. For the purpose of increasing the circuit density, many researches and developments have been dedicated to reducing the size of contact holes. Examples of patents that have tried to form small geometry contact holes are H. Liu et al. U.S. Pat. No. 5,180,689, C. Yoo et al. U.S. Pat. No. 5,203,957, S. Sun et al. U.S. Pat. No. 5,279,990, and S. Sugimoto et al. U.S. Pat. No. 5,356,834.

FIGS. 1A–1D show the conventional process of forming a contact hole. As shown in FIG. 1A. the structure of the semiconductor device includes a silicon substrate 2 having regions, gate dielectrics 22, polysilicon layers 3, and a multilayer insulation structure 4. In the process of forming a contact hole, the shape and region of the contact hole is first defined by photolithography technoloy. As shown in FIG. 1A, a photo-resist layer 5 is formed on top of the insulation layers to define the region of the contact hole 51. The insulation structure comprising an upper layer of borophosphosilicate glass and a lower layer of undoped silicon oxide is etched by an isotropic etching process. Approximately one half of the thickness of the insulating structure in the hole area is etched away as shown in FIG. 1B. The rest of the insulation structure in the contact hole is then further etched by an anisotropic etching process until the substrate is exposed as shown in FIG. 1C. Finally, the photo-resist layer 5 is removed to form the contact hole as shown in FIG. 1D.

A couple of drawbacks exist in the conventional process of forming a contact hole. Firstly, in order to decrease the size of the contact hole, expensive photo-resist and alingers with extremely high precision are requires. The cost of manufacturing the integrated circuit can not be reduced. Secondly, when the insulation layers are being etched, the photo-resist layer remains on top of the insulation layers. Therefore, polymer contamination is often a serious problem that has to be resolved.

SUMMARY OF THE INVENTION

The present invention has been made to overcome the above-mentioned drawbacks in forming a contact hole. The object of this invention is to provide a process for making a contact hole or a metal via that can be filled easily with the metal. By forming a tapered sidewall in the hole opening, the metal can be filled in the hole successfully even if the aspect ratio of the contact hole is large.

Another object of this invention is to form contact holes or metal vias that have sizes smaller than those of the holes defined by the photo-lithography technology. By forming a tapered sidewall, the actual size of the contact hole is smaller than the size of the patterning contact hole defined by the photo-lithography. The expensive photo-resist and aligner with extremely high precision are not necessary.

It is yet another object of this invention to avoid the problems associated with the polymer contamination. The formation of contact holes or metal vias of this invention includes the process of anisotropically etching the multi-layer insulating structure after the photo-resist layer has been removed. Because the photo-resist no longer exists on the surface of the insulation structure, the polymer contamination problem can be greatly alleviated.

According to the present invention, a process of forming a contact hole with tapered sidewall is presented. A semiconductor device of an integrated circuit comprising a substrate having doped regions, gate dielectrics polysilicon layers, and a multi-layer insulation structure is first prepared. A photo-resist mask layer with openings defining contact holes is formed over the surface of the insulation structure. The multi-layer insulation structure is anisotropically etched through the opening to remove approximately one half of its thickness in the opening area. A void with a vertical sidewall in the multi-layer insulating structure is thus formed below the opening area of the photo-resist layer after the etching. The photo-resist layer is then removed to expose the surface of the multi-layer insulating structure. A temporary insulating layer is deposited uniformly over the surface of the insulating structure.

The temporary insulating layer is anisotropically etched. A tapered sidewall spacer is formed by the temporary insulating layer on the vertical sidewall of the void. The multi-layer insulating structure along with the sidewall spacer is further anisotropically etched until the substrate in the opening area is exposed. Due to the existence of the tapered sidewall spacer, the surface of the insulating structure maintains a tapered sidewall profile in the opening area where the contact hole is formed. The actual size of the contact hole is also smaller than the size of the contact hole pattern defined by the photo-resist layer.

The process of this invention can also be used to form metal vias for an integrated circuit. A semiconductor device comprising two multi-layer insulating structures and a metal layer between the insulating structures is prepared for making the metal via. A photo-resist mask layer with openings defining the metal vias is established over the surface of the upper multi-layer insulating structure. The process described above can then form the metal via. The anisotropically etching process used in this invention can be accomplished by plasma etching. The preferred enchant is $CCl_2F_2$, $CHF_3/CF_4$, $CHF_4/O_2$ or $CH_3CHF_2$.

DETAILED DESCRIPTION OF THE PREFERRED EMBODIMENTS

Figure 1A:
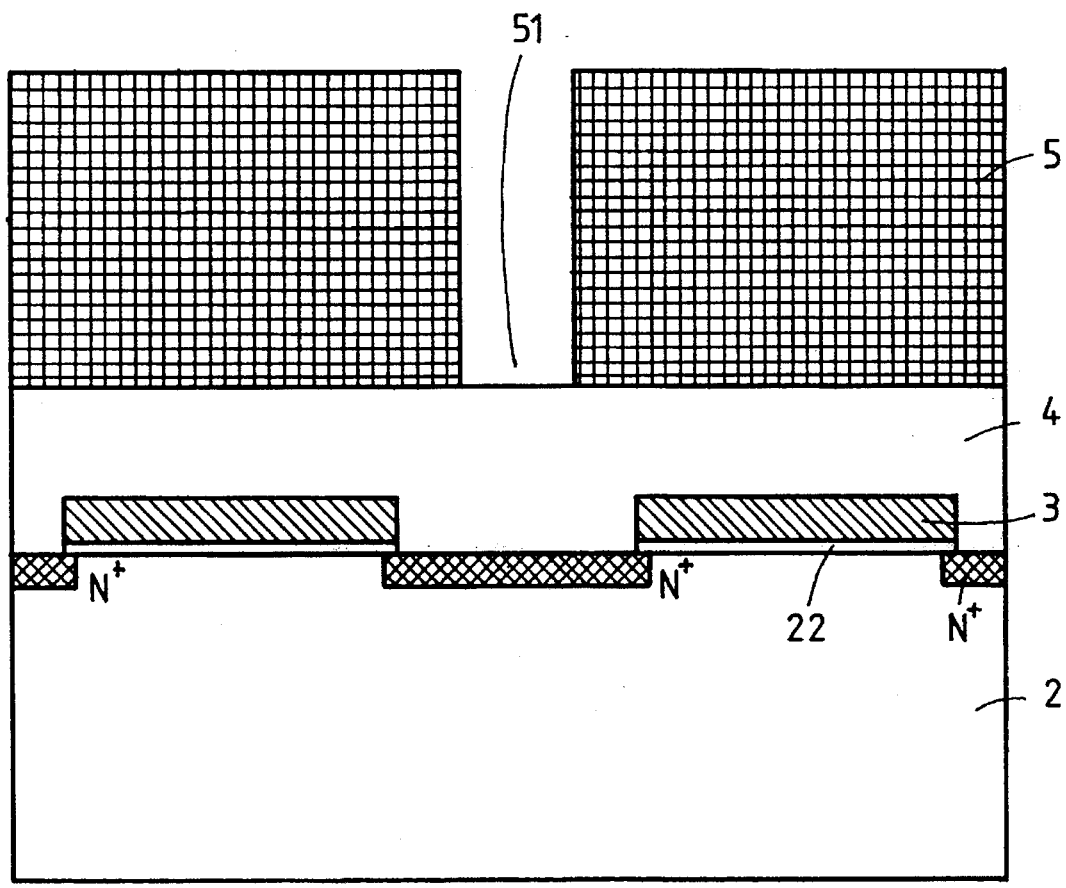
FIG. 1A–1D show the conventional process of forming a contact hole.
Figure 1B:
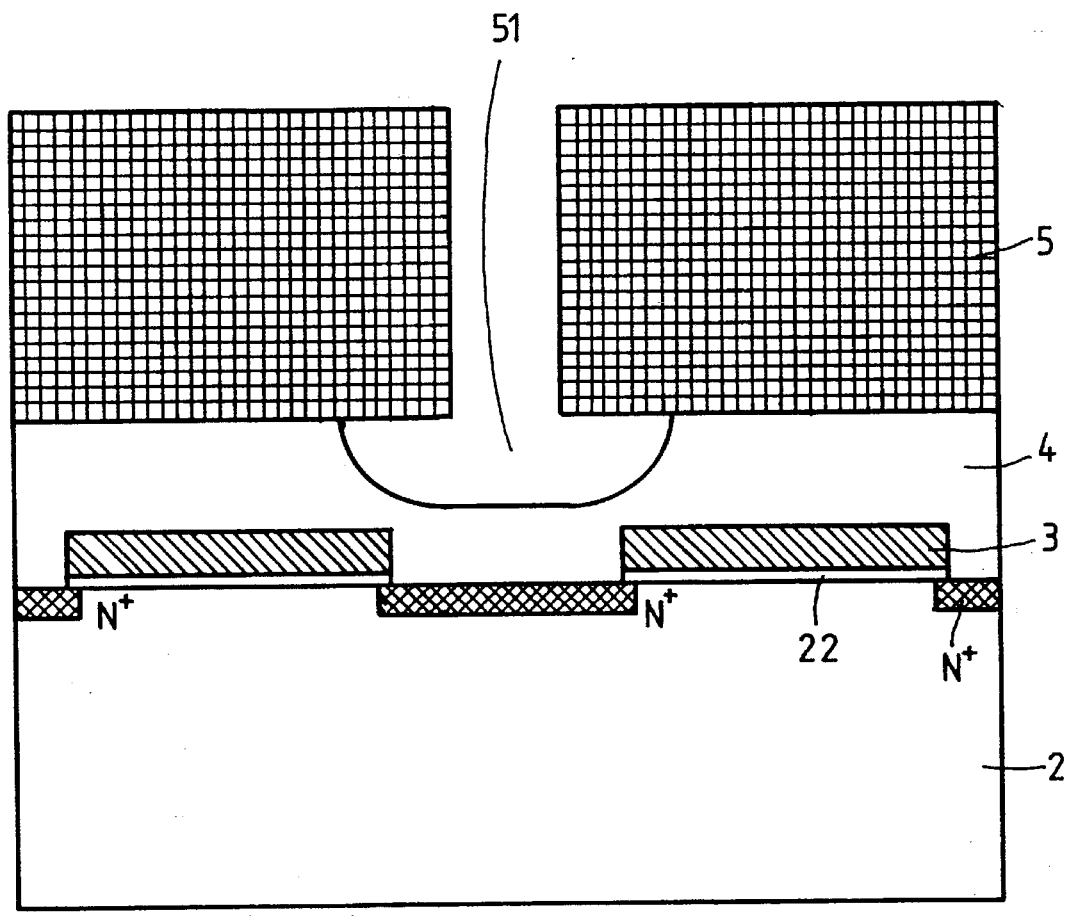
Figure 1C:
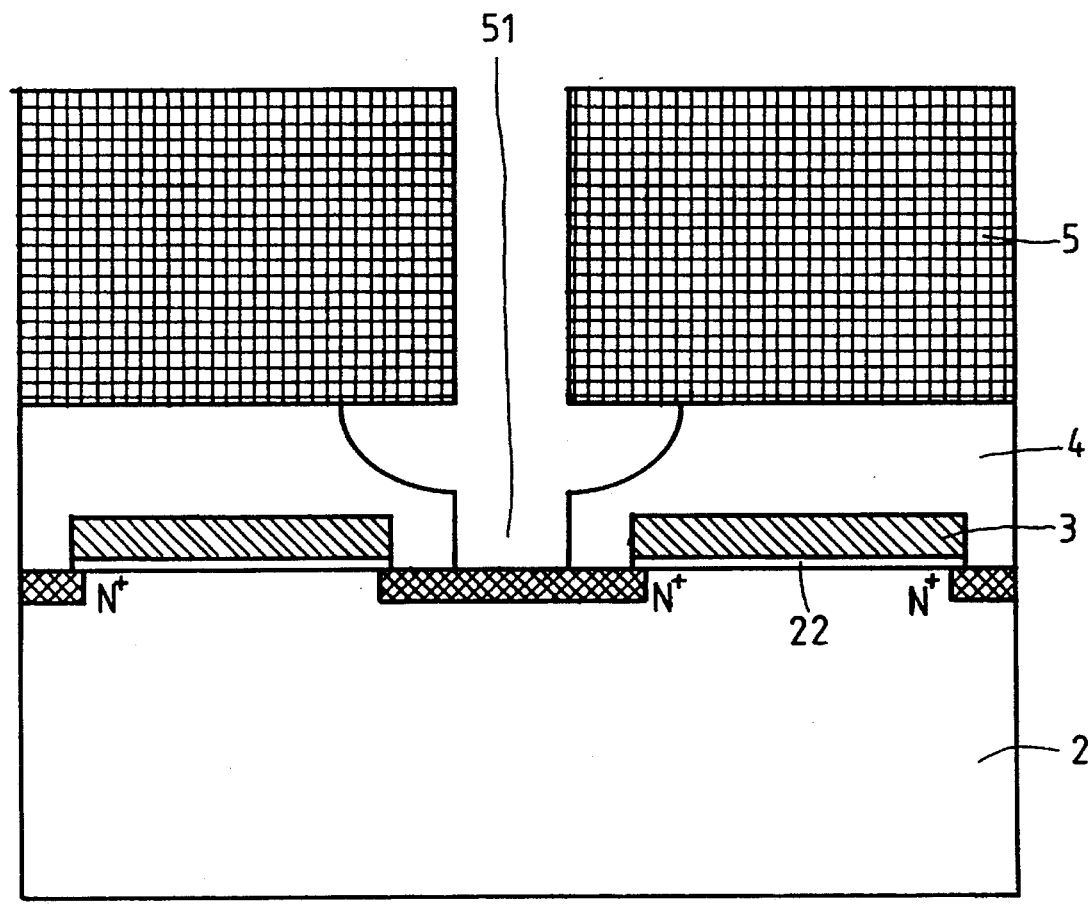
Figure 1D:
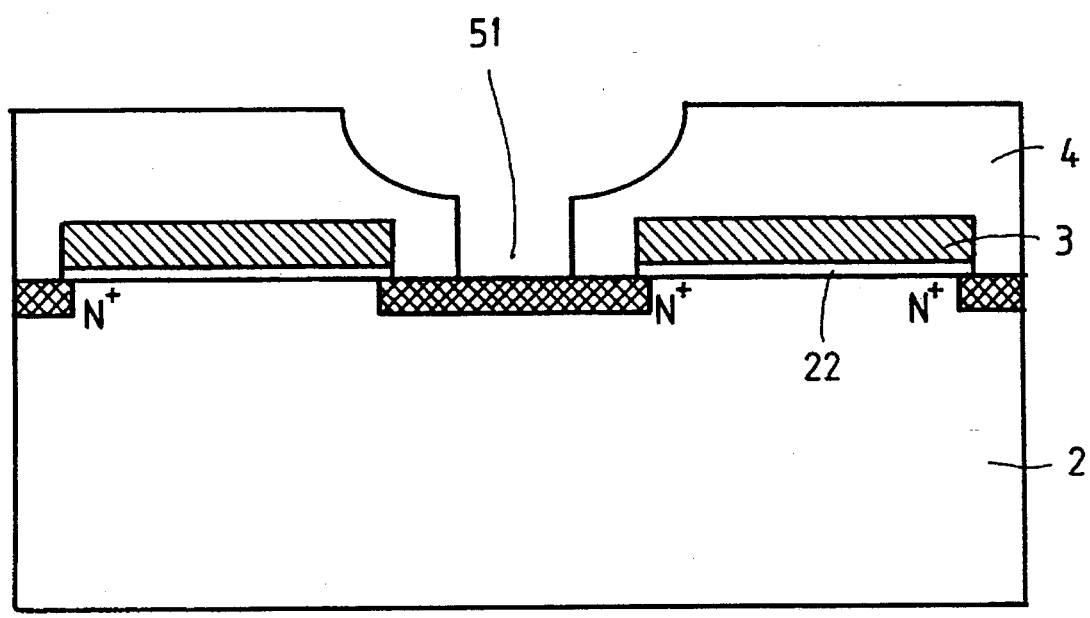
Figure 2:
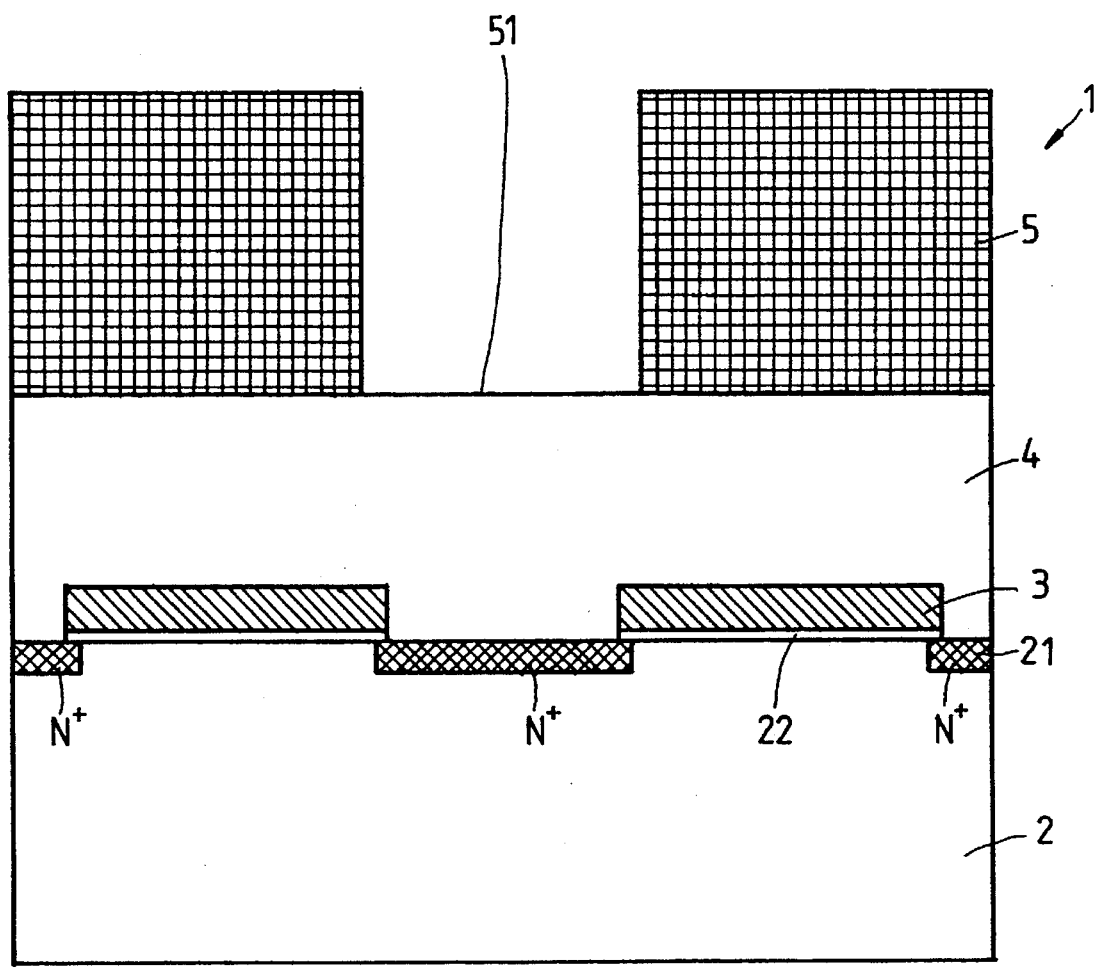
FIG. 2 shows the cross-sectional view of the semiconductor device that is ready for forming a contact hole by the process of this invention.

With reference to FIG. 2, the semiconductor device 1 that has been processed and prepared for forming a contact hole has the same structure as that shown in FIG. 1A in the conventional process. The semiconductor device 1 includes a silicon substrate 2 which can be either N-type or P-type. A plurality of $N^+$ regions 21 or $P^+$ region are formed in the substrate. Above the substrate are gate dielectrics 22 and polysilicon layers 3 having a plurality of polysilicons. A multi-layer insulating structure 4 is formed on top of both the substrate 2 and the polysilicons 3, and before all that happens, the oxide of a gate dielectric 22 with a thickness between about 70 to 200 Angstroms is formed by CVD or thermal oxide.

The multi-layer insulating structure 4 comprises a lower insulating layer having undoped silicon oxide and an upper insulating layer of borophosphoisilicate glass. Both insulating layers are deposited by CVD process. The thickness of the undoped silicon oxide layer is approximately 500 to 1500 Angstroms. The borophosphosilicate glass layer has thickness about 5000 to 12000 Angstroms. A photo-resist layer 5 has been formed on top of the multi-layer insulating structure. The patterning of the photo-resist layer is formed by the photo-lithography technology to define the shape and region of the contact hole 51. The size of the defined contact hole is larger than the size of the actually desired contact hole by 0.1 to 0.5 microns.

Figure 3:
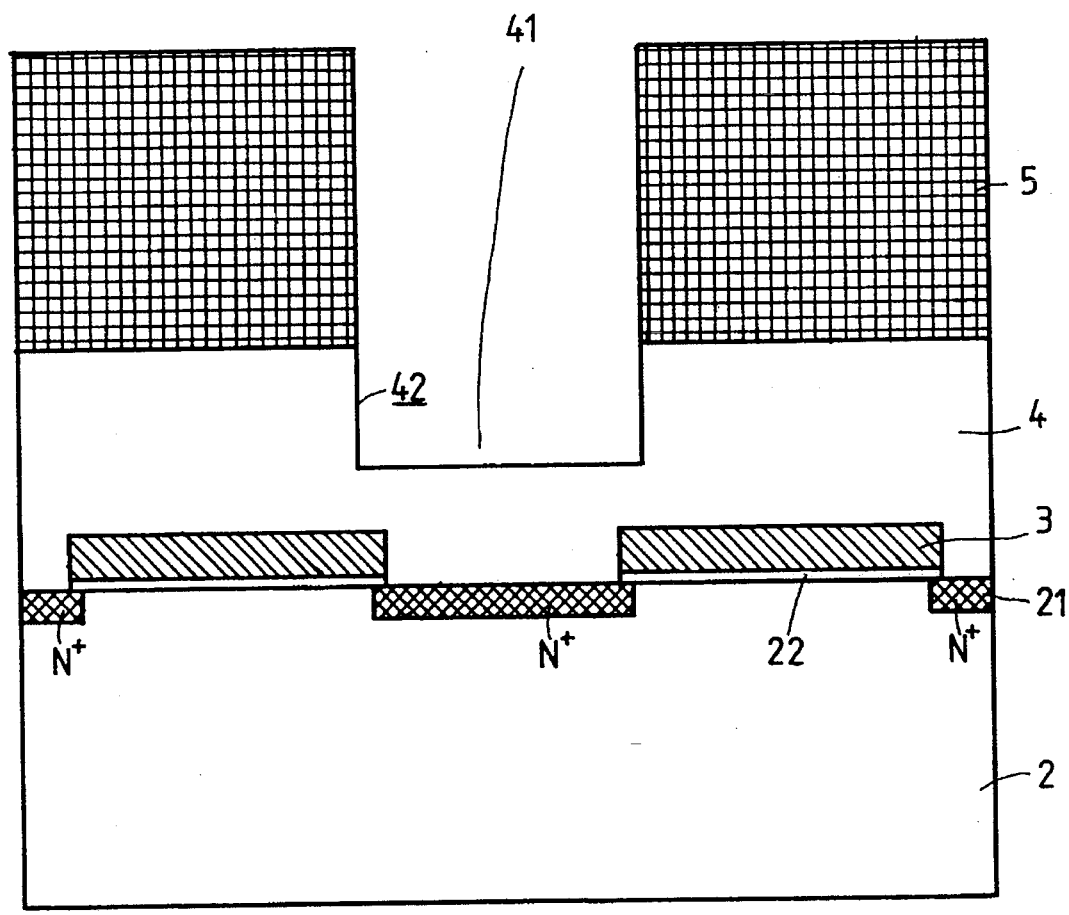
FIG. 3 shows the cross-sectional view of the semiconductor device of FIG. 2 after the anisotropic etching of the insulating layers by a plasma etching process in this invention.
Figure 4:
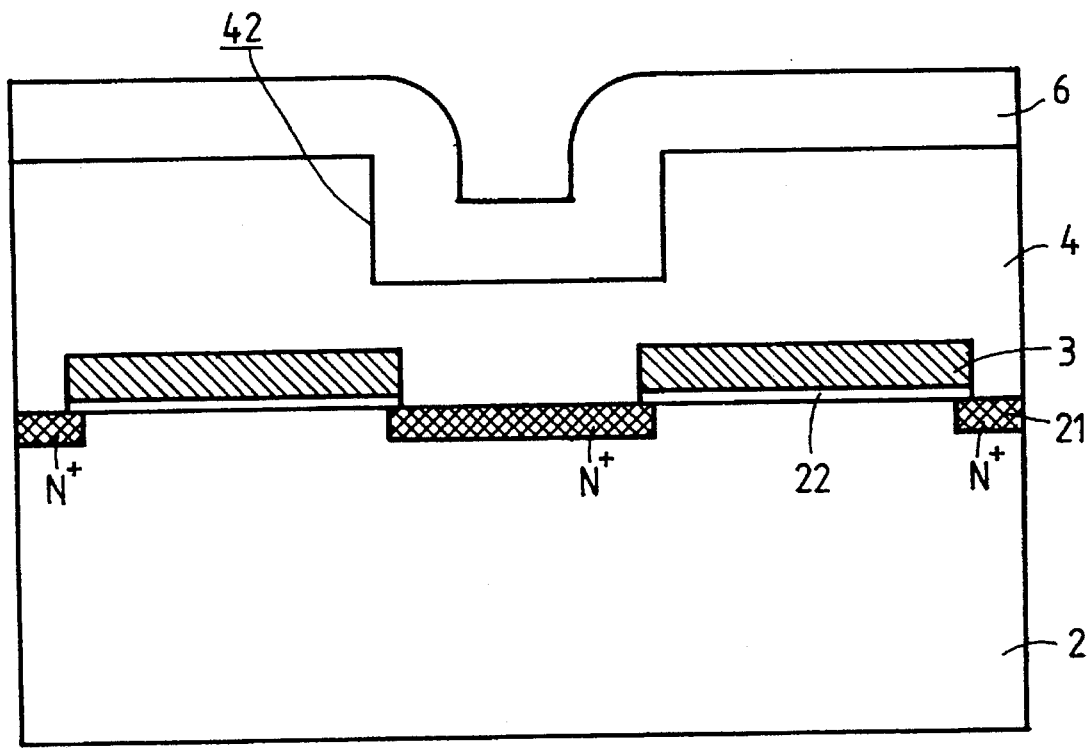
FIG. 4 shows the cross-sectional view of the semiconductor device of FIG. 3 after removing the photo-resist layer and depositing an insulating layer by CVD process in this invention.

As shown in FIG. 3, in this invention the multi-layer insulating structure is first etched by an anisotropic etching process to remove approximately one half of the thickness of the insulating structure. During the anisotropic etching, enchant ambient such as $CCl_2F_2$, $CHF_3/CF_4$, $CHF_3/O_2$ or $CH_3CHF_2$ can be used in the plasma etcher. After the etching, a vertical sidewall 42 is formed in the void 41 of the insulating structure. The next step of this invention is to remove the photo-resist layer 5 and deposit a temporary insulating layer 6 uniformly above the multi-layer insulating structure 4 using CVD process. FIG. 4 shows the cross-sectional view of the semiconductor that has an additional insulating layer 6 comprising borophosphosilicate glass. The thickness of the new insulating layer is approximately 700 to 3000 Angstroms.

Figure 5:
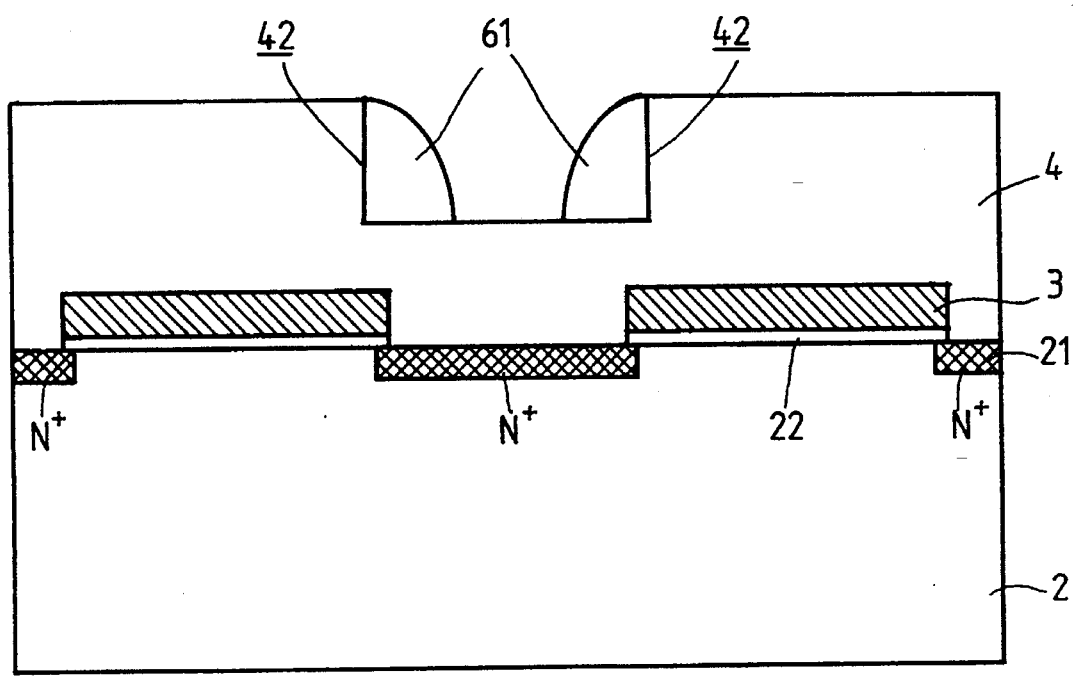
FIG. 5 shows the cross-sectional view of the semiconductor device of FIG. 4 after the anisotropic etching of the insulating layers by a plasma etching process in this invention.

The insulating layer 6 is then etched and removed by an anisotropic etching process similar to that described in the previous section. Plasma etcher with $CCl_2F_2$, $CHF_3/CF_4$, $CHF_3/O_2$ or $CH_3CHF_2$ ambient can be used during the anisotropic etching process. The thickness of the insulating layer 6 being etched away is identical to the thickness that has been newly deposited on the multi-layer insulating structure 4. In other words, the etching is to ensure that the new insulating layer 6 outside the contact hole region is removed from the top of the multi-layer insulating structure 4. However, in the void where the contact hole is to be established, a sidewall spacer 61 resulted from the new insulating layer 6 is formed on the vertical sidewall 42 as shown in FIG. 5. The size of the sidewall spacer 61 is proportional to the thickness of the new insulating layer 6 that has been deposited and removed. Therefore, the thicker the insulating layer 6, the wider the sidewall spacer 61.

Figure 6:
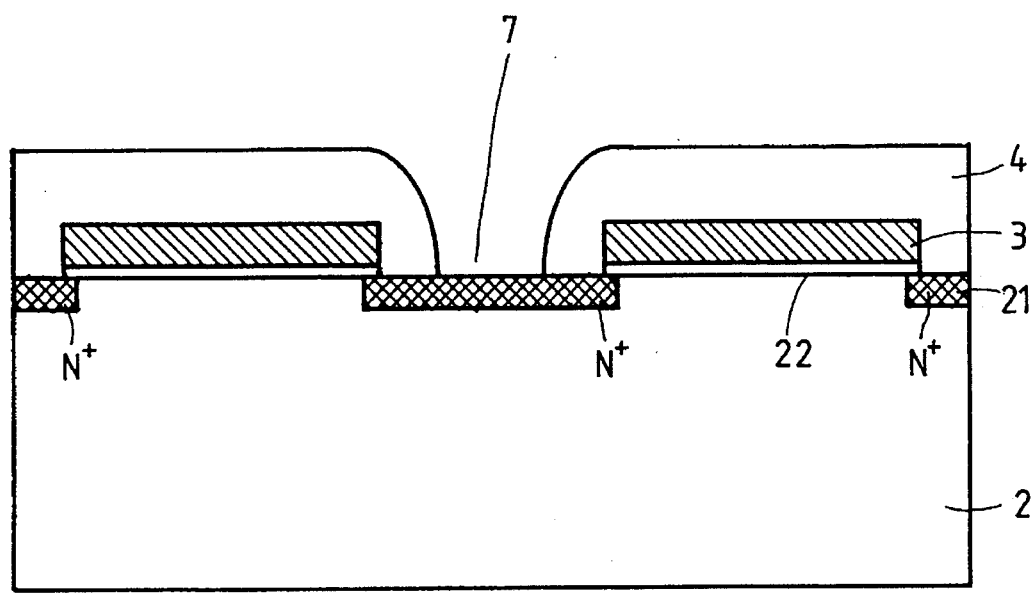
FIG. 6 shows the cross-sectional view of the contact hole formed by the process of this invention.

Finally, the surface of the multi-layer insulating structure 4 including the sidewall spacer 61 is etched by an anisotropic etching process similar to that has been described before. The etching process continues until the N+region of the substrate 2 underneath the void surrounded by the sidewall spacer 61 is exposed. Due to the existence of the sidewall spacer 61, the etched multi-layer insulating structure 4 maintains the surface profile of the sidewall spacer 61 in the contact hole area. Consequently, as shown in FIG. 6, an actual contact hole 7 having a tapered sidewall is formed above the substrate 2. The tapered sidewall of the contact hole reflects a surface profile similar to that of the sidewall spacer 61. It is worth while to point out that the anisotropic etching of the insulating layer 6 and the multi-layer insulating structure 4 can either be completed in two separate etching steps or performed at once in the same chamber.

Figure 7:
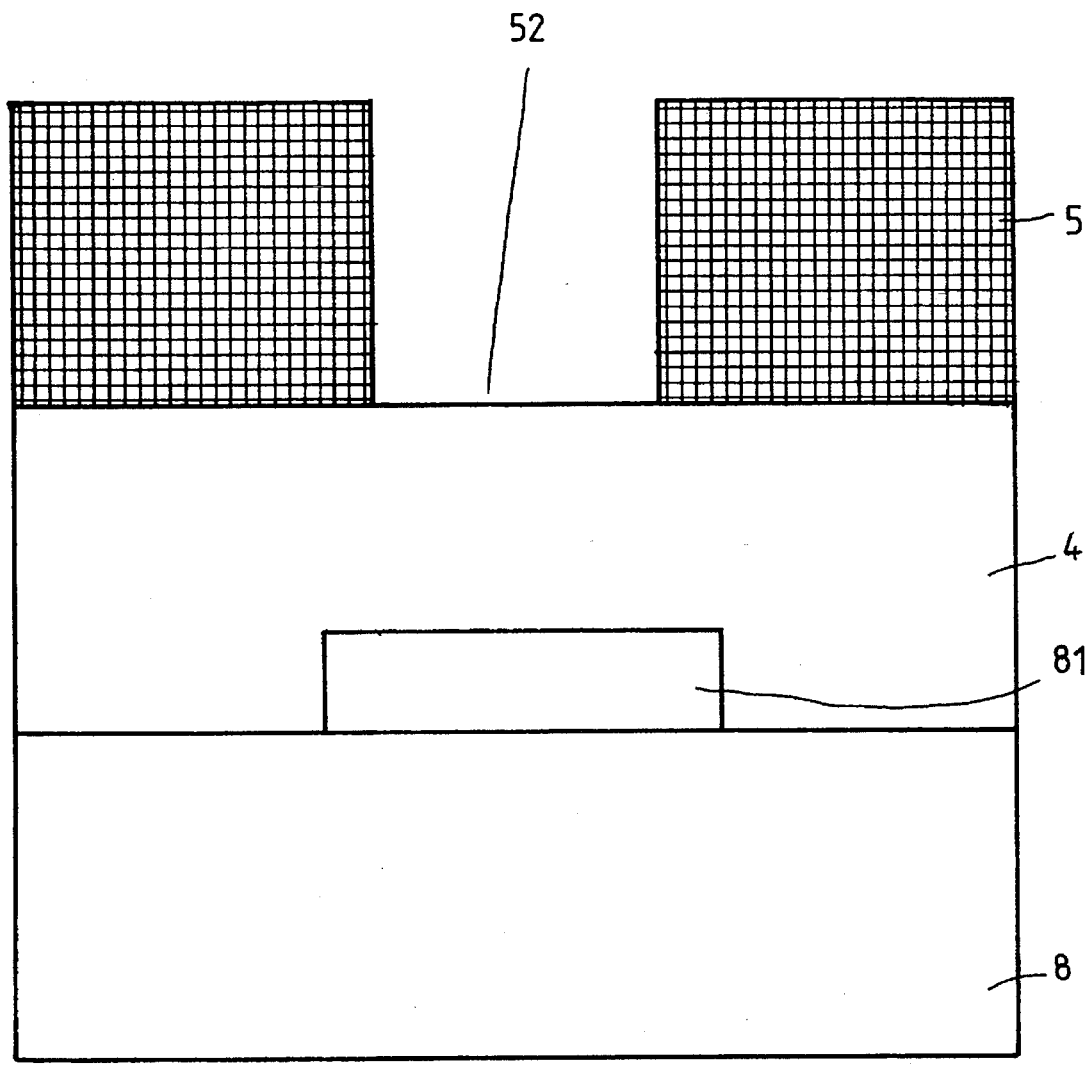
FIG. 7 shows the cross-sectional view of the semiconductor device that is ready for forming a metal via by the process of this invention.

The process of this invention can also be applied to the formation of metal vias in a semiconductor device. FIGS. 7–10 illustrate the steps of an example for forming a metal via. For easy comparison, the same structure number is used to identify the structure that has a corresponding one described in the previous description of forming a contact hole. As shown in FIG. 7, the semiconductor device includes a lower multi-layer insulating structure 8, a metal layer 81, an upper multi-layer insulating structure 4 and a photo-resist layer 5. The photo-resist layer 5 defines a void where the underneath insulating structure is to be removed to form a metal via above the metal layer 81. The multi-layer insulating structure 4 of this example comprises three insulating layers. The insulating structure can be formed by either a nonetchback sandwich spin-on-glass process or an etchback sandwich spin-on-glass process. The lower insulating layer is approximately 1000 to 3000 Angstroms of silicon oxide deposited by CVD process. The middle insulating layer is a carbon-containing spin-on-glass layer. Its thickness in roughly 2000 to 6000 Angstroms. The upper insulating layer is approximately 3000 to 9000 Angstroms of silicon oxide deposited by CVD process.

The structure of the lower multi-layer insulating structure 8 depends on whether the metal layer 81 is the first metal layer or not. If it is the first metal layer, the lower multi-layer insulating structure 8 comprises the same insulating layers as that of the multi-layer insulating structure described in the previous description of forming a contact hole. It comprises a lower insulating layer having undoped silicon oxide and an upper insulating layer of borophosphosilicate glass. If the metal layer 81 is the second or later metal layer, the lower multi-layer insulating structure 8 is similar to the upper multi-layer insulating structure.

Figure 8:
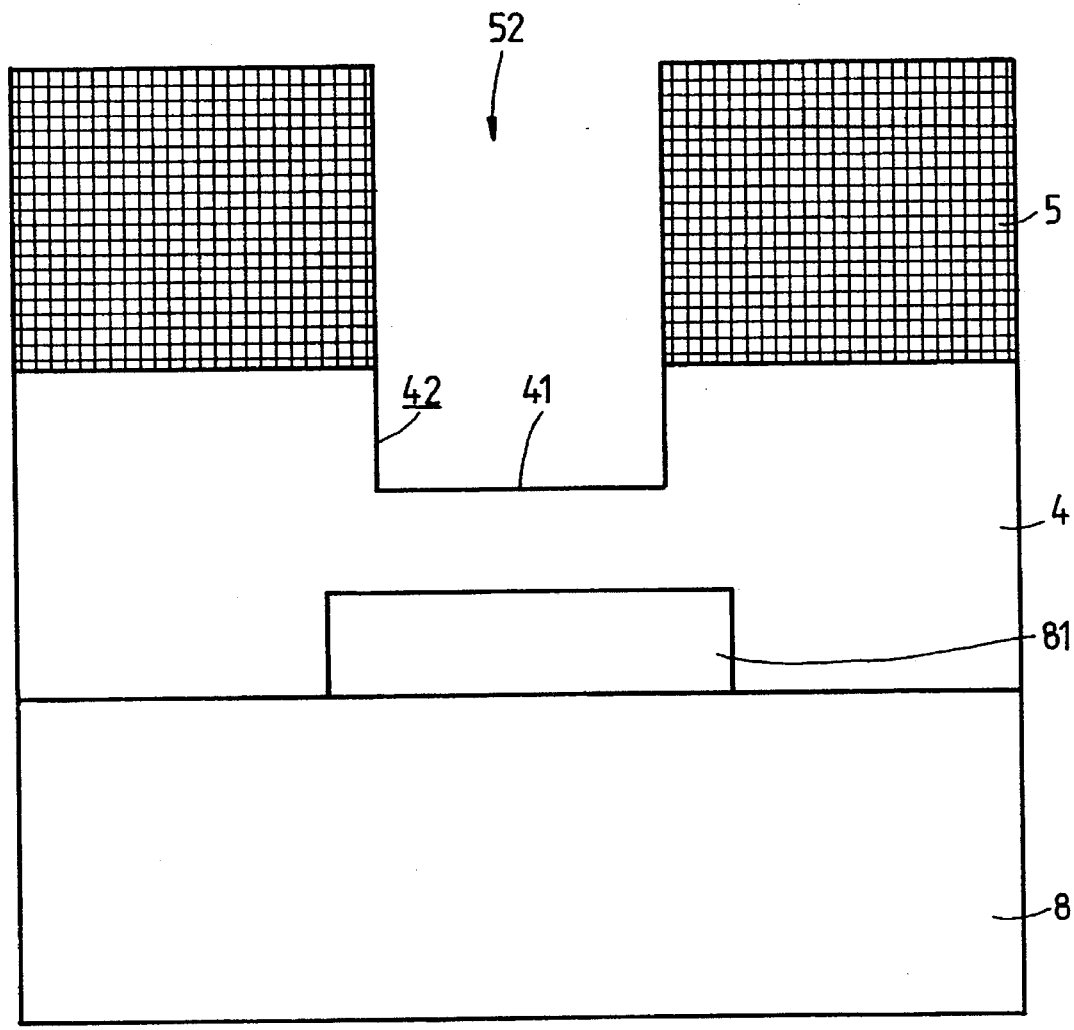
FIG. 8 shows the cross-sectional view of the semiconductor device of FIG. 7 after the anisotropic etching of the insulating layers by a plasma etching process in this invention.

Comparing FIG. 2 and FIG. 7, the silicon substrate 2 of FIG. 2 corresponds to the lower multi-layer insulating structure 8 of FIG. 7 and the $N^+$ region 21 FIG. 2 corresponds to the metal layer 81 for FIG. 7. The process of forming a contact hole described earlier can also be used to form the desired metal via. As shown in FIG. 7, the photo-resist layer 5 established by the photolithography technology defines an opening where the underneath multi-layer insulating structure is to be removed to form the metal via. Similar to the procedures described previously, the multi-layer insulating structure is etched by an anisotropic etching process. The anisotropic etching removes about one half of the thickness of the insulating structure 4 as shown in FIG. 8.

Figure 9:
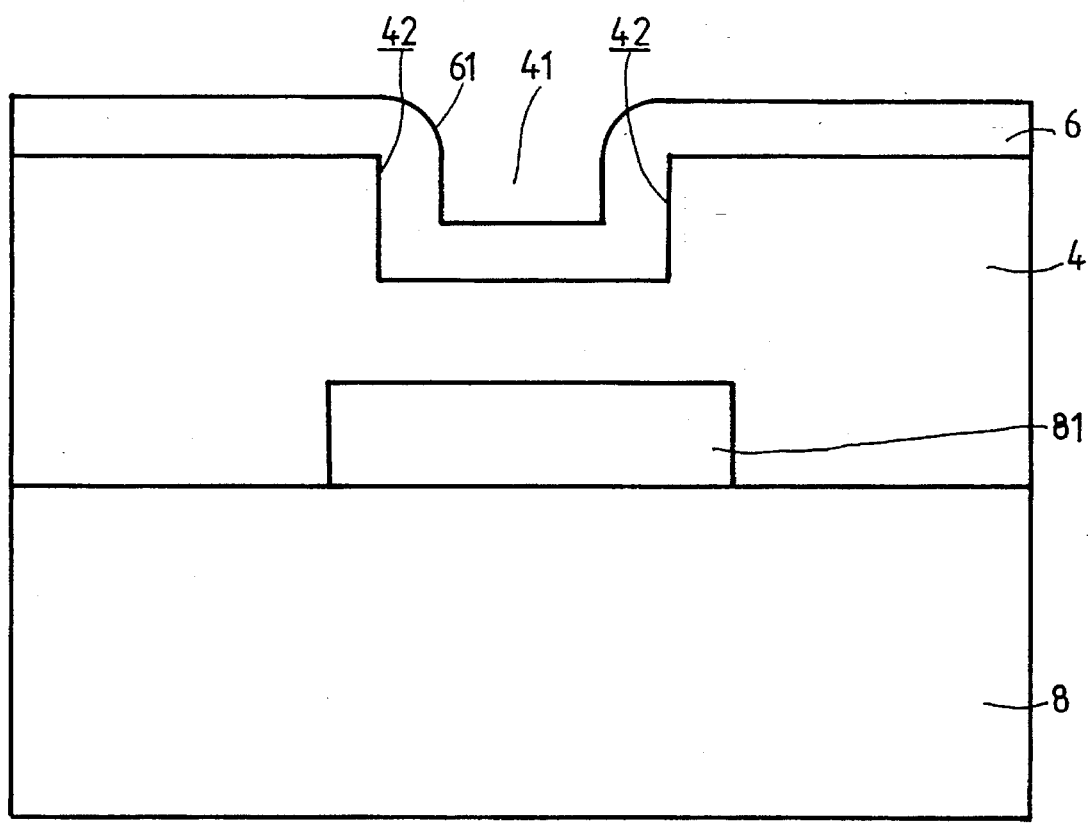
FIG. 9 shows the cross-sectional view of the semiconductor device of FIG. 8 after removing the photo-resist layer and depositing an insulating layer by CVD process in this invention.
Figure 10:
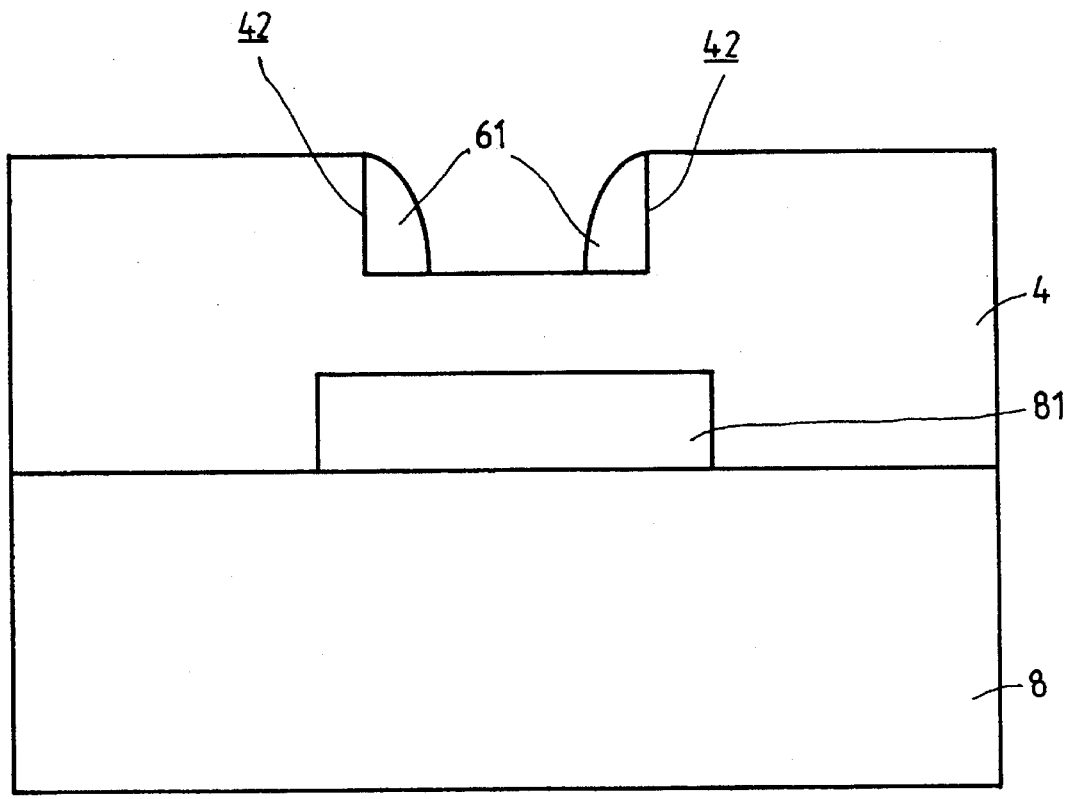
FIG. 10 shows the cross-sectional view of the semiconductor device of FIG. 9 after the anisotropic etching of the insulating layers by a plasma etching process in this invention.
Figure 11:
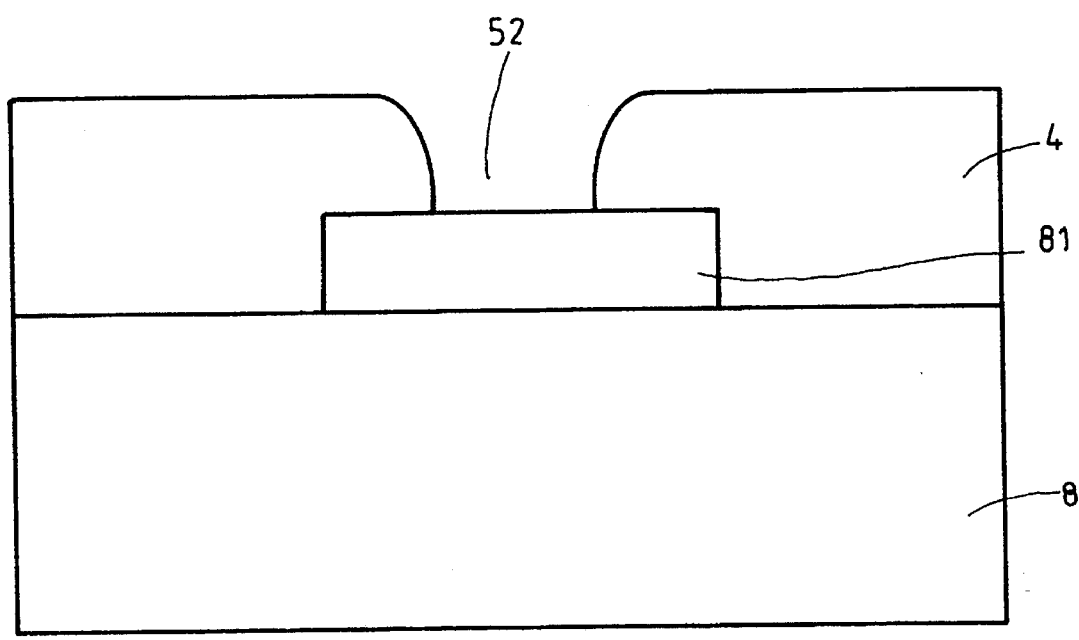
FIG. 11 shows the cross-sectional view of the metal via formed by the process of this invention.

After the etching process, the photo-resist layer 5 is removed and a new insulating layer 6 is deposited uniformly over the surface of the upper multi-layer insulating structure as shown in FIG. 9. The new insulating layer 6 has the same composition as the top layer of the upper multi-layer insulating structure 4. The new insulating layer 6 is then etched by an anisotropic etching process. The etched thickness of the new insulating layer is the same as the deposited thickness. Therefore, as shown in FIG. 10, a sidewall spacer 61 is formed on the vertical sidewall 42. Finally, the upper multi-layer insulating structure is further etched by an anisotropic etching process to expose the metal layer 81 underneath the void surrounded by the sidewall spacer 61 as illustrated in FIG. 11. As pointed out previously, the last two anisotropic etching steps can either be done separately or at once in the same chamber.

As discussed in the previous sections, the process of this invention creates a sidewall spacer on the vertical sidewall in the contact hole or metal via area. The succeeding anisotropic etching process removes the surface layer of the upper multi-layer insulating structure. Therefore, the surface profile introduced by the sidewall spacer is maintained during the etching process and a tapered sidewall is established for the contact hole or the metal via. The actual size of the contact hole is thus smaller than the size defined by the photo-resist layer. Consequently, an important advantage of this invention is that the process can effectively reduce the size of the contact hole or the metal via.

Another advantage of this invention is that the contact hole or the metal via has a tapered sidewall. Due to the desired high circuit density in the semiconductor device, the size of the contact hole of the metal via becomes smaller and smaller. The aspect ratio of the hole is also increasing. It becomes more difficult to completely fill the hole with metal. The tapered sidewall formed in the process of this invention can alleviate the problem and make the filling of the hole easier.

As described in the previous sections, the process of this invention comprises either one or two anisotropic etching processes after the photo-resist layer has been removed to finish the formation of the contact hole or the metal via. Because the photo-resist layer no longer exists during the above-mentioned anisotropic etching process, the problem associated with polymer contamination is significantly reduced.

Although only the preferred embodiments of this invention were shown and described in the above description, it is requested that any modification or combination that comes within the spirit of this invention be protected.

What we claimed is:

1. A process of forming a contact hole having a tapered sidewall in an integrated circuit comprising the steps of:

preparing a semiconductor substrate having a gate dielectric and a plurality of polysilicons on the top surface of said substrate and a plurality of doped regions inside the top surface of said substrate;

establishing a multi-layer insulating structure above said substrate and said polysilicons, said multi-layer insulating structure having a top insulating layer;

forming a photo-resist layer over said multi-layer insulating structure, said photo-resist layer having an opening defining an area for forming said contact hole and the size of said opening being slightly larger than the size of said contact hole;

anisotropically etching into said multi-layer insulating structure to remove about one half of the thickness of said multi-layer insulating structure through said opening, and forming a void having a vertical sidewall in said multi-layer insulating structure;

removing said photo-resist layer to expose said multi-layer insulating structure;

depositing a temporary insulating layer having the same composition as said top insulating layer uniformly over the surface of said multi-layer insulating structure;

anisotropically etching said temporary insulating layer to expose the top surface of said multi-layer insulating structure and forming a sidewall spacer having a tapered shape on said vertical sidewall, said spacer being a remaining part of said temporary insulating layer;

and anisotropically etching said multi-layer insulating structure and said spacer until said substrate is exposed in said opening and said spacer is removed.

2. The process of forming a contact hole having a tapered sidewall in an integrated circuit according to claim 1, wherein said multi-layer insulating structure comprises a bottom layer of undoped silicon oxide having a thickness between about 500 and 1500 Angstroms and a top layer of borophosphosilicate glass having a thickness between about 5000 and 12000 Angstroms.

3. The process of forming a contact hole having a tapered sidewall in an integrated circuit according to claim 1, wherein said temporary insulating layer has a thickness between about 700 and 3000 Angstroms and comprises borophosphosilicate glass.

4. The process of forming a contact hole having a tapered sidewall in an integrated circuit according to claim 1, wherein the step of anisotropically etching said temporary insulating layer and the following step of anisotropically etching said multi-layer insulating structure as well as said spacer are combined and accomplished in a continuous anisotropically etching process within a same chamber.

5. A process of forming a metal via having a tapered sidewall in an integrated circuit comprising the steps of:

preparing a semiconductor device including a lower multi-layer insulating structure, said lower multi-layer insulating structure having a top surface and a metal layer formed over a part of said top surface;

establishing an upper multi-layer insulating structure above said top surface and said metal layer, said multi-layer insulating structure having a top insulating layer;

forming a photo-resist layer over said upper multi-layer insulating structure, said photo-resist layer having an opening defining an area for forming said metal via and the size of said opening being slightly larger than the size of said metal via;

anisotropically etching into said upper multi-layer insulating structure to remove about one half of the thickness of said upper multi-layer insulating structure through said opening, and forming a void having a vertical sidewall in said upper multi-layer insulating structure;

removing said photo-resist layer to expose said upper multi-layer insulating structure;

depositing a temporary insulating layer having the same composition as said top insulating layer uniformly over the surface of said upper multi-layer insulating structure;

anisotropically etching said temporary insulating layer to expose the top surface of said upper multi-layer insulating structure and forming a sidewall spacer having a tapered shape on said vertical sidewall, said spacer being a remaining part of said temporary insulating layer;

and anisotropically etching said upper multi-layer insulating structure and said spacer until said metal layer is exposed in said opening and said spacer is removed.

6. The process of forming a metal via having a tapered sidewall in an integrated circuit according to claim 5, wherein both said lower multi-layer insulating structure and said upper multi-layer insulating structure comprise a lower insulating layer of silicon oxide having a thickness between about 1000 and 3000 Angstroms, a middle insulating layer spin-on-glass having a thickness between about 2000 and 6000 Angstroms, and an upper insulating layer of silicon oxide having a thickness between about 3000 and 9000 Angstroms.

7. The process of forming a metal via having a tapered sidewall in an integrated circuit according to claim 5, wherein said upper multi-layer insulating structure comprises a lower insulating layer of silicon oxide having a thickness between about 1000 and 3000 Angstroms, a middle insulating layer of spin-on-glass having a thickness between about 2000 and 6000 Angstroms, and an upper insulating layer of silicon oxide having a thickness between about 3000 and 9000 Angstroms; and said lower multilayer insulating structure comprises a lower insulating layer of undoped silicon oxide having a thickness between about 500 and 1500 Angstrom and an upper insulating layer of borophosphosilicate glass having a thickness between about 5000 and 12000 Angstroms.

8. The process of forming a metal via having a tapered sidewall in an integrated circuit according to claim 5, wherein said temporary insulating layer has a thickness between about 700 and 3000 Angstroms and comprises silicon oxide.

9. The process of forming a metal via having a tapered sidewall in an integrated circuit according to claim 5, wherein the step of anisotropically etching said temporary insulating layer and the following step of anisotropically etching said upper multi-layer insulating structure as well as said spacer are combined and accomplished in a continuous anisotropically etching process within a same chamber.

* * * * *